(12) United States Patent
Zhang

(10) Patent No.: US 7,545,028 B2
(45) Date of Patent: Jun. 9, 2009

(54) SOLDER BALL ASSEMBLY FOR A SEMICONDUCTOR DEVICE AND METHOD OF FABRICATING SAME

(75) Inventor: Leilei Zhang, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 55 days.

(21) Appl. No.: 11/818,665

(22) Filed: Jun. 14, 2007

(65) Prior Publication Data

US 2007/0246817 A1    Oct. 25, 2007

Related U.S. Application Data

(62) Division of application No. 11/053,510, filed on Feb. 8, 2005, now Pat. No. 7,241,640.

(51) Int. Cl.
*H01L 23/02* (2006.01)
(52) U.S. Cl. .............. 257/678; 257/738; 257/777; 257/780; 257/E21.257; 257/E21.499; 257/E21.508
(58) Field of Classification Search ................ 257/678, 257/701, 734, 738, 777, 778, 780, 782
See application file for complete search history.

(56) References Cited

U.S. PATENT DOCUMENTS

| | | | |
|---|---|---|---|
| 5,216,278 A | 6/1993 | Lin et al. | |
| 6,130,479 A | 10/2000 | Chalco et al. | |
| 6,180,265 B1 | 1/2001 | Erickson | |
| 6,201,305 B1 * | 3/2001 | Darveaux et al. | 257/779 |
| 6,306,751 B1 | 10/2001 | Patel et al. | |
| 6,485,843 B1 | 11/2002 | Eslamy | |
| 6,583,040 B1 | 6/2003 | Lin | |
| 6,673,710 B1 | 1/2004 | Lin | |
| 6,762,503 B2 | 7/2004 | Lee | |
| 6,940,179 B2 * | 9/2005 | Lee | 257/780 |
| 7,241,640 B1 * | 7/2007 | Zhang | 438/106 |

* cited by examiner

*Primary Examiner*—David Nhu
(74) *Attorney, Agent, or Firm*—Robert M. Brush

(57) ABSTRACT

Solder ball assembly for a semiconductor device and method of fabricating the same is described. In one example, a solder mask is formed on a substrate having an aperture exposing at least a portion of a conductive pad of the substrate. A solder pillar is formed in the aperture and in electrical communication with the conductive pad. An insulating layer is formed on the solder mask exposing at least a portion of the solder pillar. The exposed portion of the solder pillar is removed to define a mounting surface. A solder ball is formed on the mounting surface in electrical communication with the solder pillar. The solder pillar may include high-temperature solder having a melting point higher than that of the solder ball.

12 Claims, 4 Drawing Sheets

SOLDER BALL ASSEMBLY FOR A SEMICONDUCTOR DEVICE AND METHOD OF FABRICATING SAME

FIELD OF THE INVENTION

One or more aspects of the present invention relate generally to mounting and connecting electronic devices and, more particularly, to a solder ball assembly for a semiconductor device and method of fabricating the same.

BACKGROUND OF THE INVENTION

An increasing demand for electronic equipment that is smaller, lighter, and more compact has resulted in a concomitant demand for semiconductor packages that have smaller outlines and mounting areas or "footprints." One response to this demand has been the development of the ball grid array (BGA) semiconductor package, which "surface mounts" and electronically connects to an associated carrier substrate (e.g., a printed circuit board (PCB)) with a plurality of solder balls. Another response has been the development of the "flip-chip" method of attachment and connection of semiconductor chips or "dice" to substrates (e.g., PCBs or leadframes). Flip-chip mounting involves the formation of bumped contacts (e.g., solder balls) on the active surface of the die, then inverting or "flipping" the die upside down and reflowing the bumped contacts (i.e., heating the bumped contacts to the melting point) to fuse them to the corresponding pads on the substrate.

In both the flip-chip die and BGA package mounting and connection methods, thermo-mechanical reliability is becoming an increasing concern of the electronic industry. Notably, the board-level reliability of the solder-joints is becoming one of the most critical issues for successful application of such mounting and connection methods.

For example, BGA packages are being used to house integrated circuits that are operating at increasing higher speeds. Heatsinks are being mounted to the BGA package to improve the overall package thermal performance. In some cases, the heatsink is relatively heavy compared to the overall weight of the BGA package. For example, the heatsink may comprise much as 60 percent of the total weight. Such a heatsink will reduce the final solder joint standoff when the package is mounted to a supporting substrate (e.g., PCB). The solder joint standoff is the distance between the substrate and the package. A lower standoff reduces package board level reliability.

Accordingly, there exists a need in the art for a solder ball assembly for a semiconductor device that provides for improved solder joint standoff and package board level reliability.

SUMMARY OF THE INVENTION

Solder ball assembly for a semiconductor device and method of fabricating the same is described. In one embodiment, a solder mask is formed on a substrate having an aperture exposing at least a portion of a conductive pad of the substrate. A solder pillar is formed in the aperture and in electrical communication with the conductive pad. An insulating layer is formed on the solder mask exposing at least a portion of the solder pillar. The exposed portion of the solder pillar is removed to define a mounting surface. A solder ball is formed on the mounting surface in electrical communication with the solder pillar. In one embodiment, the solder pillar comprises high-temperature solder having a melting point higher than that of the solder ball. The solder pillar provides for improved solder joint standoff when the substrate is mounted to a carrier substrate, as compared to the direct formation of a solder ball on the conductive pad. The substrate may comprise an integrated circuit package, or a semiconductor die.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Solder ball assembly for a semiconductor device and a method of fabricating the same is described. One or more aspects of the invention are described with respect to a solder ball assembly for an integrated circuit package, such as a ball grid array (BGA) package. Those skilled in the art will appreciate that the invention may be used with other types of packages and substrates having solder balls or bumped contacts, including semiconductor dice having bumped contacts for flip-chip bonding.

Figure 1:
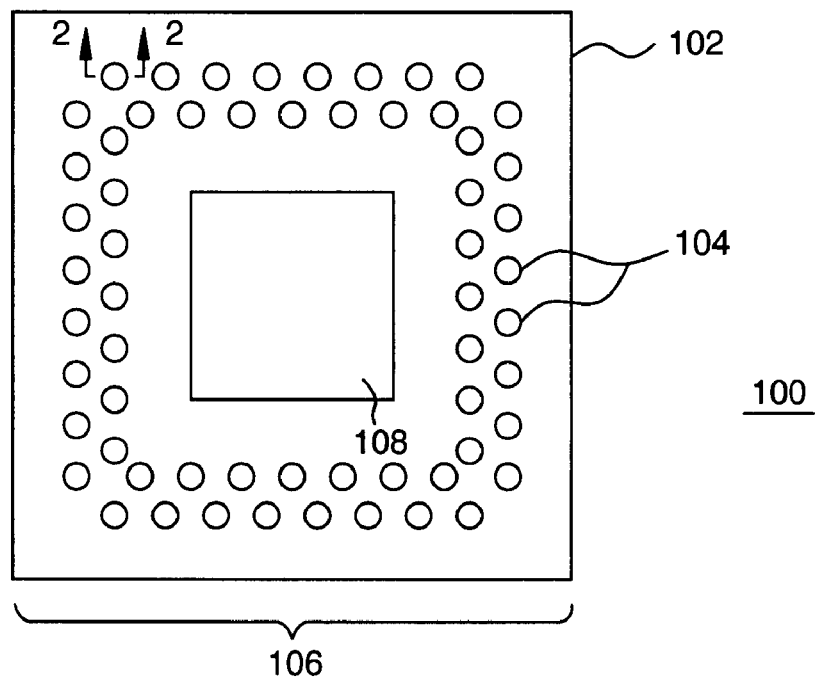
FIG. 1 is a plan view of a semiconductor device 100.

FIG. 1 is a plan view of a semiconductor device 100. The device 100 includes a substrate 102 having a plurality of solder balls 104 formed in a ball grid array 106. The substrate 102 comprises an integrated circuit package having a semiconductor die 108 mounted thereon. For example, the substrate 102 may comprise BGA package, chip-scale BGA package, micro BGA package, and the like. The semiconductor device 100 is configured to be surface mounted to a carrier substrate (e.g., printed circuit board (PCB)).

Figure 9:
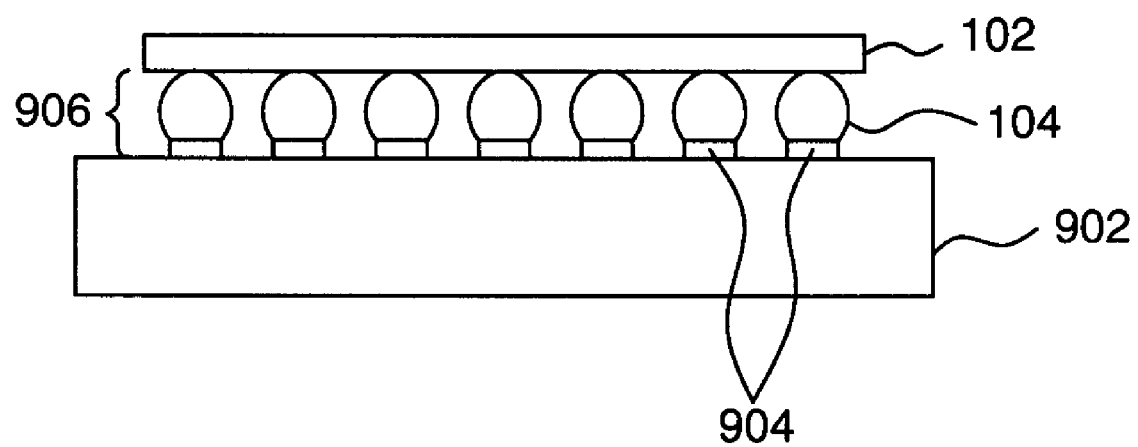
FIG. 9 is a side view of the semiconductor device of FIG. 1 mounted to a carrier substrate.

Notably, FIG. 9 is a side view of the semiconductor device 100 mounted to a carrier substrate 902. The semiconductor device 100 is surface mounted by registering the solder balls 104 with matching conductors 904 on the carrier substrate 902 and then reflowing the solder balls 104 to form solder joints. The solder joints provide an electrical and mechanical connection between the matching conductors 904 and conductors in the semiconductor device 100 (not shown). As described below, the invention provides for improved solder joint standoff, which is the distance 906 between the carrier substrate 902 and the substrate 102 of the semiconductor device 100.

Figure 2:
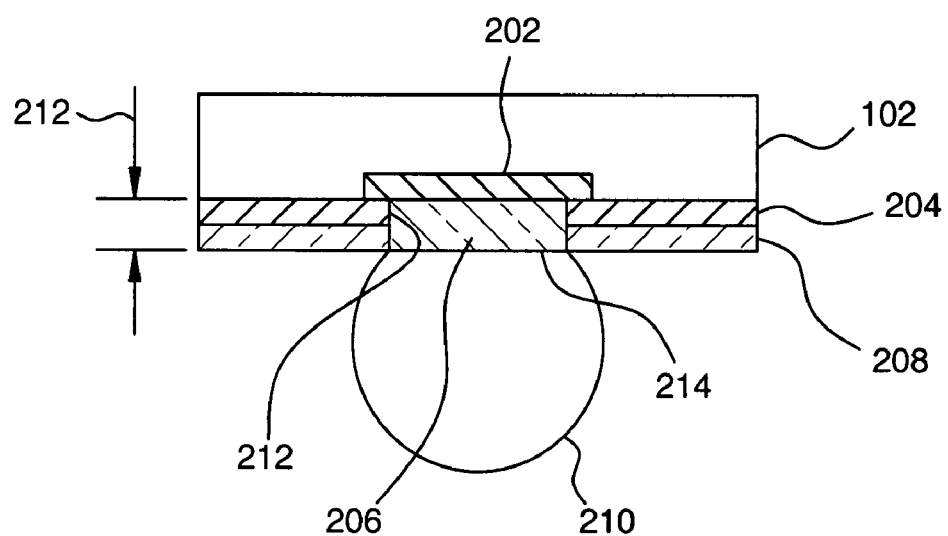
FIG. 2 is a cross-sectional view of the semiconductor device of FIG. 1 taken along the line 2-2 of FIG. 1.

In particular, FIG. 2 is a cross-sectional view of the semiconductor device 100 taken along the line 2-2 of FIG. 1 looking into the substrate 102 and one of the solder balls 104. The substrate 102 may comprise a sheet of insulative material, such as bismaleimide, triazine, flexible polymide film or tape, fiberglass, ceramic, silicon, and like type integrated circuit packaging materials known in the art. Alternatively, the substrate 102 may comprise a semiconductor chip or die (e.g., a die configured for flip-chip bonding). The substrate 102 comprises a layer of metal (e.g., copper, aluminum, gold, silver, nickel, tin, platinum, or a multilayer combination of the aforementioned metals that has been laminated and/or plated on a surface of the substrate 102) that is patterned using known photolithography techniques to define a bond pad 202. The bond pad 202 may be in electrical communication with one or more circuit traces (not shown) or a plated through-hole, called a "via" (not shown), as is well known in the art.

An insulative layer in the form of a solder mask 204 is formed over the substrate 102 and a portion of the bond pad 202. The solder mask 204 may comprise an acrylic or a polyimide plastic or, alternatively, an epoxy resin that is silk screened or spin-coated on the substrate 102. A dry film solder mask may also be employed. An aperture 212 is formed in the solder mask 204 to expose at least a portion of the bond pad 202. A solder pillar 206 is formed within the aperture 212 that is electrically and mechanically connected to the exposed portion of the bond pad 202. The solder pillar 206 comprises a high-temperature solder. For example, the solder pillar 206 may comprise a high-lead solder with a melting temperature of approximately 310 degrees Celsius, or a lead-free solder with a melting temperature of approximately 220 degrees Celsius.

An exemplary process for forming the solder pillar 206 is described below. Briefly stated, the solder pillar 206 may be screen-printed and reflowed to form a mechanical and electrical connection to the bond pad 202. An insulating layer 208 comprising an underfill material or a molding compound is formed over the solder mask 204 around the solder pillar 208. An exposed portion of the solder pillar 206 that extends above the insulating layer 208 is removed to define a mounting surface 214. A solder ball 210 is then formed on the mounting surface 214 using a conventional reflow process known in the art. The solder ball 210 comprises solder with a melting temperature that is lower than that of the solder pillar 206 such that the solar ball 210 may be reflowed without melting the solder pillar 206. The mounting surface 214 may be plated with a solderability enhancement layer (e.g., a layer of nickel, followed by a layer of gold) to improve solderability. The solder pillar 208 provides for improved solder joint standoff as compared to forming the solder ball 210 directly on the bond pad 202.

Figure 3:
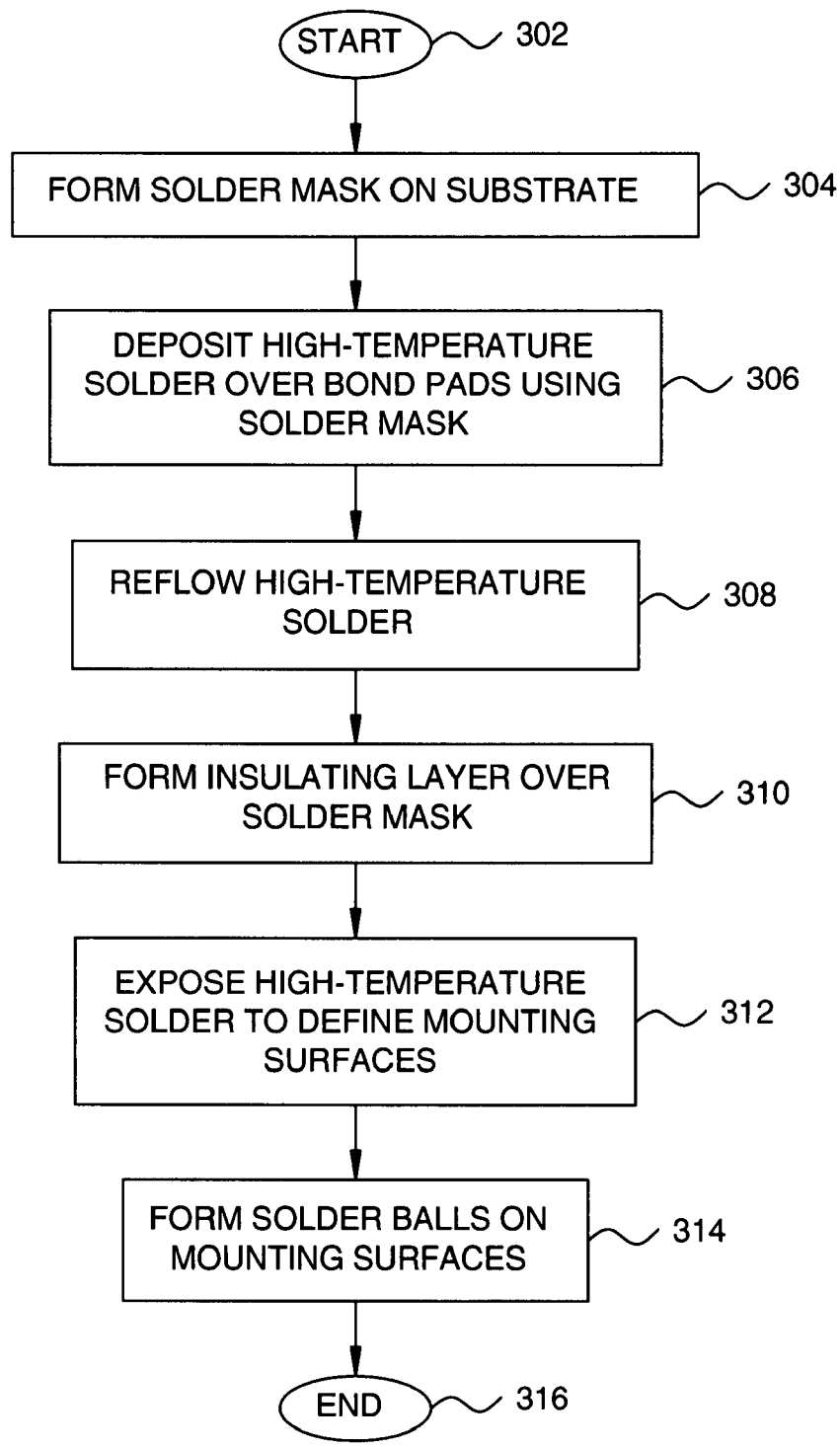
FIG. 3 is a flow diagram depicting an exemplary embodiment of a method of fabricating a solder ball assembly for a semiconductor device in accordance with the invention.

FIG. 3 is a flow diagram depicting an exemplary embodiment of a method 300 of fabricating a solder ball assembly for a semiconductor device in accordance with the invention. The method 300 begins at step 302. At step 304, a solder mask is formed on the substrate 102. The solder mask is formed to include apertures exposing at least a portion of each of the bond pads formed in the substrate. At step 306, high-temperature solder is deposited over the bond pads using the solder mask to form solder pillars. In one embodiment, the high-temperature solder may be formed using a conventional screen-printing process. Alternatively, the high-temperature solder may be formed using a solder reflow process or a physical vapor deposition (PVD) process.

At step 308, the high-temperature solder elements are reflowed to form a mechanical and electrical connection to the respective bond pads. At step 310, an insulating layer is formed over the solder mask and around the high-temperature solder pillar. The insulating layer exposes at least a portion of each high-temperature solder pillar. At step 312, the exposed portions of the high-temperature solder pillars are removed (e.g., exposed to heat) to define mounting surfaces. At step 314, solder balls are formed on the mounting surfaces. The solder balls may be formed using a conventional reflow process for placing solder balls. The method 300 ends at step 316.

FIGS. 4-8 depict sequential cross-sectional views of the semiconductor device 100 of FIG. 1 corresponding to various steps of the method 300 of FIG. 3. The cross-sectional views of FIGS. 4-8 illustrate the solder ball assembly shown in the cross-section of FIG. 2. Elements in FIGS. 4-8 that are the same as those in FIG. 2 are designated with identical reference numerals. For purposes of clarity by example, FIGS. 4-8 show only a single bond pad of the semiconductor device 100.

Figure 4:
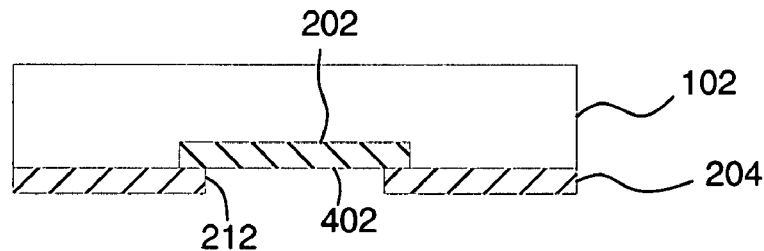
FIGS. 4-8 depict sequential cross-sectional views of the semiconductor device of FIG. 1 corresponding to various steps of the method of FIG. 3.
Figure 5:
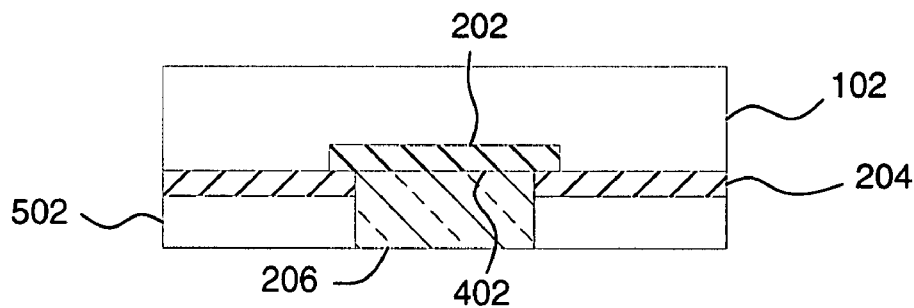

In particular, FIG. 4 depicts a cross-section of the semiconductor device 100 after the formation of the solder mask 204 at step 304. The aperture 212 in the solder mask 204 exposes a portion 402 of the bond pad 202. FIG. 5 depicts a cross-section of the semiconductor device 100 after the deposition of the high-temperature solder at step 306. In one embodiment, the solder pillar 206 may be deposited by forming a stencil 502 over the solder mask 204 and screen-printing the high-temperature solder. Alternatively, the solder pillar 206 may be formed using a conventional reflow process or a PVD process.

Figure 6:
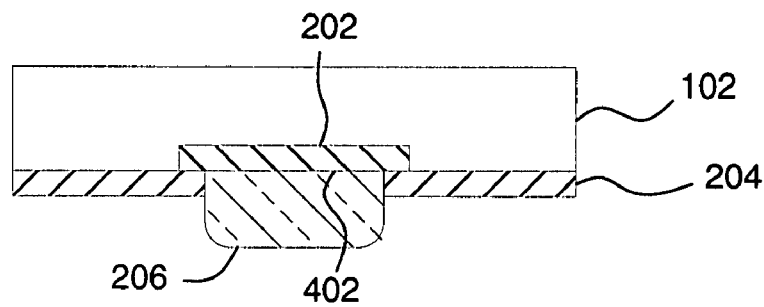
Figure 7:
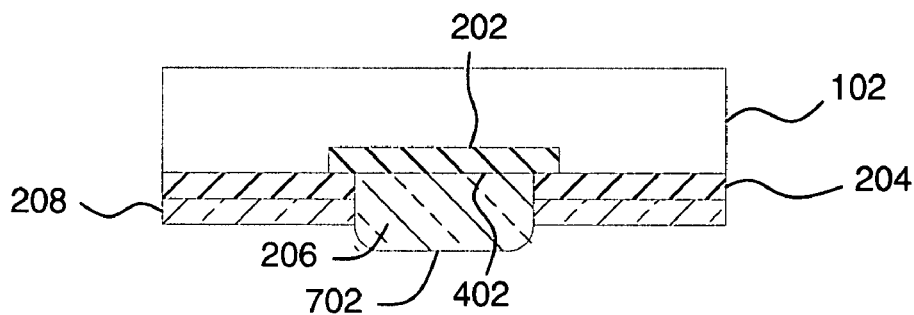
Figure 8:
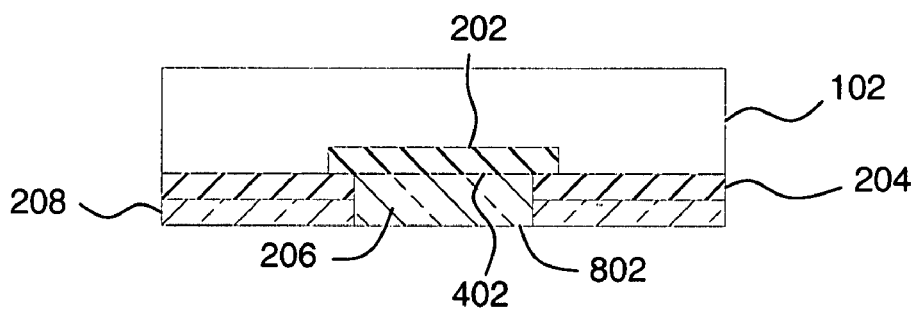

FIG. 6 is a cross-section of the semiconductor device 100 after the high-temperature solder pillars have been reflowed at step 308. After reflow, the solder pillar 206 is mechanically connected to the surface 402 and in electrical communication with the bond bad 202. FIG. 7 is a cross-section of the semiconductor device 100 after the insulating layer 208 has been formed at step 310. The insulating layer 208 is formed so as to expose a portion 702 of the solder pillar 206. FIG. 8 is a cross-section of the semiconductor device 100 after the high-temperature solder has been exposed at step 312. The exposed portion 702 of the solder pillar 206 is removed to define the mounting surface 802. The cross-section of FIG. 2 shows the solder ball assembly after the formation of the solder balls at step 314. The solder ball 210 may be formed on the mounting surface 802.

Solder ball assembly for a semiconductor device and a method of fabricating the same is described. In one embodiment, the solder ball assembly includes a high-temperature solder pillar disposed between each bond pad in a substrate and its respective solder ball. The high-temperature solder pillars provide for improved solder joint standoff when the substrate is mounted to a carrier substrate, as compared to the direct formation of solder balls on the bond pads. The solder ball assembly may be used with integrated circuit packages, such as a BGA package, and with bumped semiconductor dice, such as semiconductor dice configured for flip-chip bonding.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A solder ball assembly, comprising:
    a solder mask formed on a substrate having an aperture exposing at least a portion of a conductive pad of said substrate;
    a solder pillar formed in said aperture in electrical communication with said conductive pad;
    an insulating layer formed on the solder mask exposing at least a portion of said solder pillar and defining a mounting surface of said solder pillar; and
    a solder ball formed on said mounting surface in electrical communication with said solder pillar.

2. The solder ball assembly of claim 1, wherein said solder pillar comprises high-temperature solder having a melting point higher than said solder ball.

3. The solder ball assembly of claim 1, wherein said insulating layer comprises an underfill compound.

4. The solder ball assembly of claim 1, wherein said insulating layer comprises a molding compound.

5. The solder ball assembly of claim 1, wherein said substrate comprises a semiconductor die.

6. The solder ball assembly of claim 1, wherein said substrate comprises an integrated circuit package substrate.

7. An integrated circuit device, comprising:
a substrate;
an integrated circuit formed on the substrate;
a plurality of conductive pads formed in the integrated circuit, each conductive pad of the plurality of conductive pads being enabled to form an electrical coupling with a portion of the integrated circuit;
a solder mask formed on said substrate having an aperture exposing at least a portion of a conductive pad of said plurality of conductive pads;
a solder pillar formed in said aperture, said solder pillar and said conductive pad being electrically coupled;
an insulating layer formed on the solder mask exposing at least a portion of said solder pillar and defining a mounting surface of said solder pillar; and
a solder ball formed on said mounting surface in electrical communication with said solder pillar.

8. The integrated circuit device of claim 7, wherein said solder pillar comprises high-temperature solder having a melting point higher than said solder ball.

9. The integrated circuit device of claim 7, wherein said insulating layer comprises an under-fill compound.

10. The integrated circuit device of claim 7, wherein said insulating layer comprises a molding compound.

11. The integrated circuit device of claim 7, wherein said substrate comprises a semiconductor die.

12. The integrated circuit device of claim 7, wherein said substrate comprises an integrated circuit package substrate.

\* \* \* \* \*